United States Patent [19]
Hayden et al.

[11] Patent Number: 5,243,203
[45] Date of Patent: * Sep. 7, 1993

[54] COMPACT TRANSISTOR PAIR LAYOUT AND METHOD THEREOF

[75] Inventors: James D. Hayden; Frank K. Baker, both of Austin, Tex.

[73] Assignee: Motorola, Inc., Schaumburg, Ill.

[*] Notice: The portion of the term of this patent subsequent to Mar. 10, 2009 has been disclaimed.

[21] Appl. No.: 787,155

[22] Filed: Nov. 4, 1991

[51] Int. Cl.$^5$ .......................................... H01L 27/01
[52] U.S. Cl. ..................................... 257/66; 257/368; 257/903
[58] Field of Search .................. 357/42, 41, 23.7; 257/69, 350, 369, 903, 66, 351, 368

[56] References Cited

U.S. PATENT DOCUMENTS

| | | | |
|---|---|---|---|
| 5,001,539 | 3/1991 | Inoue et al. | 357/41 |
| 5,034,797 | 7/1991 | Yamanaka et al. | 357/42 |
| 5,095,347 | 3/1992 | Kirsch | 357/42 |

FOREIGN PATENT DOCUMENTS

| | | | |
|---|---|---|---|
| 436323 | 10/1991 | European Pat. Off. | |
| 61-208253 | 9/1986 | Japan | 357/23.7 |
| 63-53965 | 7/1988 | Japan | 357/42 |

OTHER PUBLICATIONS

Complementary FET Memory Cell, IBM Technical Disclosures Bulletin, by R. R. Garnache, published May 1976.

*Primary Examiner*—Andrew J. James
*Assistant Examiner*—Courtney A. Bowers
*Attorney, Agent, or Firm*—Robert L. King

[57] ABSTRACT

A pair of first and second thin film transistors (TFTs). The transistors are formed from a first continuous, conductive region (38) and a second continuous, conductive region (39) which underlies the first conductive region (38). The first transistor has a source region (50), a drain region (54), and a channel region (52) created from three distinct and separate regions of conductor region (39). The first transistor has a gate region (53) that overlies the channel region (52). The gate region (53) is formed from a distinct region of conductive region (38). The second transistor has a source region (44), a drain region (48), and a channel region (46) which are created from three distinct and separate regions of conductor region (38). The second transistor has a gate region (47) that underlies the channel region (46). The gate region (47) is formed from a distinct region of conductive region (39).

18 Claims, 2 Drawing Sheets

COMPACT TRANSISTOR PAIR LAYOUT AND METHOD THEREOF

CROSS REFERENCE TO A RELATED APPLICATION

This application is related to a co-pending U.S. patent application Ser. No. 07/561,385, now U.S. Pat. No. 5,095,347, entitled "A Plural Transistor Silicon on Insulator Structure with Shared Electrodes", by Howard Clayton Kirsch, and assigned to the assignee hereof.

FIELD OF THE INVENTION

The present invention relates generally to semiconductor devices, and more particularly, to transistor layout.

BACKGROUND OF THE INVENTION

In order to decrease circuit cost, increase circuit density, and increase performance of an integrated circuit, the integrated circuit industry has continually sought to reduce integrated circuit surface area. In markets such as advanced microprocessors and memory circuits, very compact devices are crucial in order to develop future generations of integrated circuits. Fast static random access memory (FSRAM) technology is a portion of the integrated circuit market that has produced a large number of advances in surface area reduction of integrated circuits (ICs). Most of the surface area reductions achieved in FSRAM technology have been due to advances in transistor layout and fabrication.

Initially, transistors in memory cells were fabricated in a conventional, planar manner. In planar technology, memory cell transistors are placed next to each other separated by a physical space limited by photolithographic and other process requirements. Electrical connection between the memory cell transistors is achieved via overlying polysilicon, metal or other conductive layers. The need for larger amounts of memory on an integrated circuit is resulting in a movement away from conventional planar transistors for use in memory designs and designs requiring compact circuits.

The IC industry began to research transistors, especially load transistors, fabricated on a substrate-overlying conductor such as polysilicon. By fabricating transistors overlying the substrate, the substrate could be used for other purposes besides holding load transistors and the surface area of a FSRAM memory cell would therefore decrease.

The substrate-overlying transistors, referred to as thin film transistors (TFTs), mentioned above have been typically manufactured in two ways. The first way is to create a pair of load transistors that are over-gated or top-gated. Over-gated transistors are transistors that each have a source, a drain, and a channel region created from a first polysilicon layer. A gate for this transistor is formed by an overlying second layer of polysilicon. Together, sources, drains, and channel regions in the first polysilicon layer and gates in the second overlying polysilicon layer form pairs of load transistors for an FSRAM cell resulting in reduced cell surface area.

The second way in which thin film transistors have been made is by under-gated or bottom-gated polysilicon transistors. Under-gated transistors are transistors that have a source, a drain, and a channel region created from a second polysilicon layer. A gate for this type of transistor is formed by an underlying first layer of polysilicon. Together, sources, drains, and channel regions in the first polysilicon layer and gates in the second underlying polysilicon layer form pairs of load transistors for an FSRAM cell resulting in reduced cell surface area.

Although over-gated pairs of transistors and under-gated pairs of transistors helped to reduce memory cell surface area, these pairs of transistors may not be capable of providing circuit densities necessary for future generations of FSRAM cells. In addition, most of the conventional TFT pair designs contain three to five contacts, and the etch steps required to etch some of these contact openings are not trivial. A pair of load transistors with reduced surface area or improved operational performance is needed for future memory generations.

SUMMARY OF THE INVENTION

The previously mentioned needs are fulfilled and other advantages achieved with the present invention. In one form, the present invention comprises a layout of a pair of first and second transistors. The pair of transistors comprises a first continuous, conductive layer of material. The first layer of material has first, second, third, and fourth physically distinct regions which respectively function as a first current electrode of the first transistor, a channel region of the first transistor, a second current electrode of the first transistor, and a control electrode of the second transistor. A second continuous conductive layer of material overlies the first continuous, conductive layer of material. The second layer of material has first, second, third, and fourth physically distinct regions which respectively function as a first current electrode of the second transistor, a channel region of the second transistor, a second current electrode of the second transistor, and a control electrode of the first transistor.

The present invention will be understood by one skilled in the art from the detailed description below in conjunction with the accompanying drawings.

DESCRIPTION OF THE PREFERRED EMBODIMENT

Figure 1:
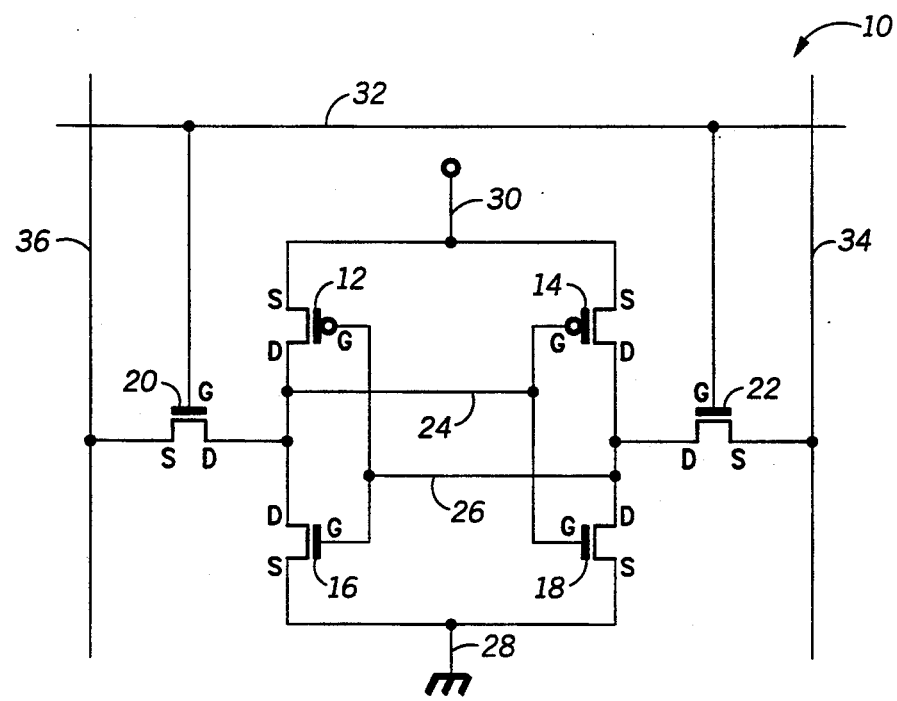
FIG. 1 illustrates, in logic diagram form, a conventional FSRAM cell.

Illustrated in FIG. 1 is a logic diagram of a conventional FSRAM cell 10. FSRAM cell 10 has a pair of first and second load transistors respectively illustrated and referred to as transistors 12 and 14. Each of transistors 12 and 14 has a P-type conductivity. FSRAM cells are usually manufactured using a flip-flop. A flip-flop is a circuit which has a first inverter, with an input node and an output node, and a second inverter, with an input node and an output node. The first inverter input node is connected to the second inverter output node, and the second inverter input node is connected to the output node of the first inverter. Each inverter is made up of an N-type conductivity transistor and a P-type conductivity transistor for complementary metal oxide semiconductor (CMOS) technology. A second half of the FSRAM flip-flop, or in other words the N-type transistors, are formed by a pair of N-type transistors 16 and 18. Together, transistor 12, 14, 16, and 18 and their interconnections form a flip-flop.

N-type pass transistors 20 and 22 allow for the flip-flop, or the FSRAM cell 10, to be programmed or written to a logic value of "on" or "off". "On" and "off" for an integrated circuit can be interpreted in many ways. "On" can be interpreted as high current, and "off" can be interpreted as low current. "On" can be interpreted as high voltage, and "off" can be interpreted as low voltage. "On" can also be interpreted as a logic one, and "off" can be interpreted as a logic zero. All of these interpretations depend upon the circuit application and the integrated circuit manufacturer. The transistors 20 and 22 not only allow FSRAM writing, they also allow the FSRAM cell 10 to be read. Writing implies that the FSRAM cell 10 is being set to a value of "on" or "off", and reading implies that some external circuitry (not illustrated) is trying to access the value of "on" or "off" stored in the FSRAM cell 10. All the transistors in FIG. 1 have a source "S", a drain "D", a gate "G", and a channel region (not labeled).

A first storage node conductor, referred to as a conductor 24, connects the drain of transistor 12, the drain of transistor 16, and the drain of transistor 20 to both the gate of transistor 14 and the gate of transistor 18. A second storage node conductor, referred to as a conductor 26, connects the drain of transistor 14, the drain of transistor 18, and the drain of transistor 22 to both the gate of transistor 12 and the gate of transistor 16. A ground conductor 28 connects the source of transistor 16 and the source of transistor 18 to a low potential or low voltage known as ground. A power supply conductor 30 connects a power supply of the integrated circuit to both the source of transistor 12 and the source of transistor 14. The flip-flop is completely formed by transistor 12, 14,16 and 18.

A select logic conductor 32 is connected to both the gate of transistor 20 and the gate of transistor 22. The conductor 32 is connected to external logic (not illustrated) that can be designed into the integrated circuit that contains FSRAM cell 10 or be completely external from the integrated circuit that contains FSRAM cell 10. The external logic is used to enable access to the FSRAM cell 10 when a cell read or cell write is occurring. A bit line conductor 34 is connected to the source of transistor 22. Conductor 34 transmits a value of "on" or "off" from the FSRAM cell 10 when a cell read is occurring and provides an "on" or "off" value for the FSRAM cell 10 when a cell write is occurring. A bit line conductor 36 is connected to the source of transistor 20. Conductor 36 transmits a value of "off" or "on" from the FSRAM cell 10 when a cell read is occurring and provides an "off" or "on" value for the FSRAM cell 10 when a cell write is occurring. Conductor 36 always, during a read or a write, carries a value that is opposite the value carried by conductor 34. For example, if conductor 34 is "on" during a write, conductor 36 is "off" and vice versa.

Figure 2:
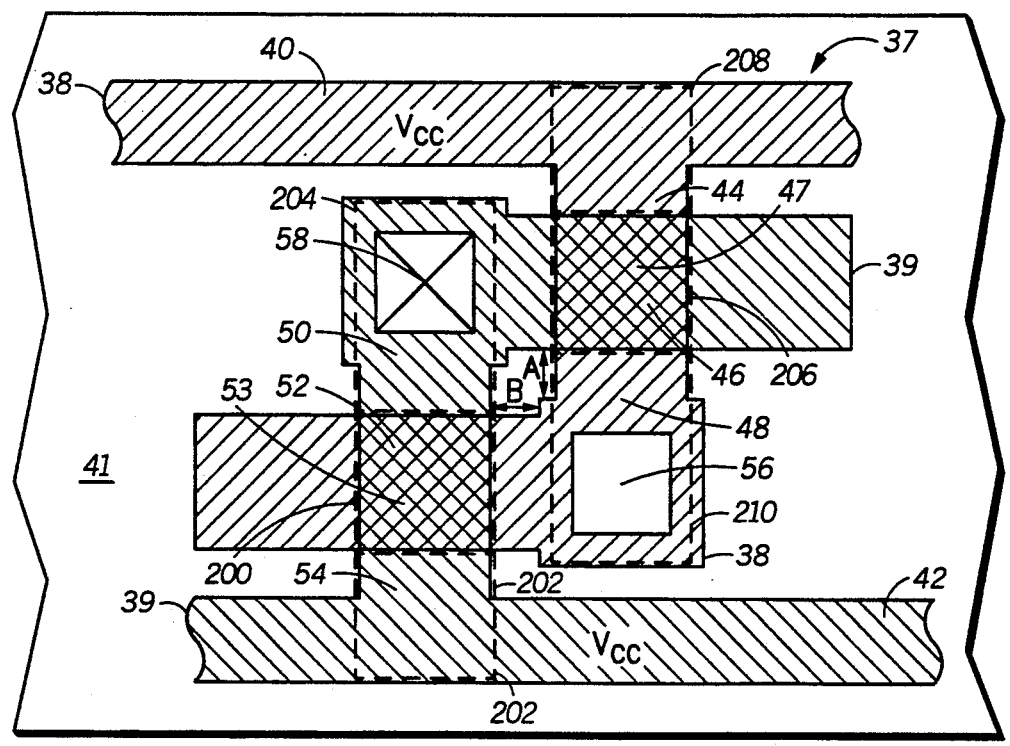
FIG. 2 illustrates, in top perspective view, a layout of a pair of load transistors in accordance with the present invention.
Figure 4:
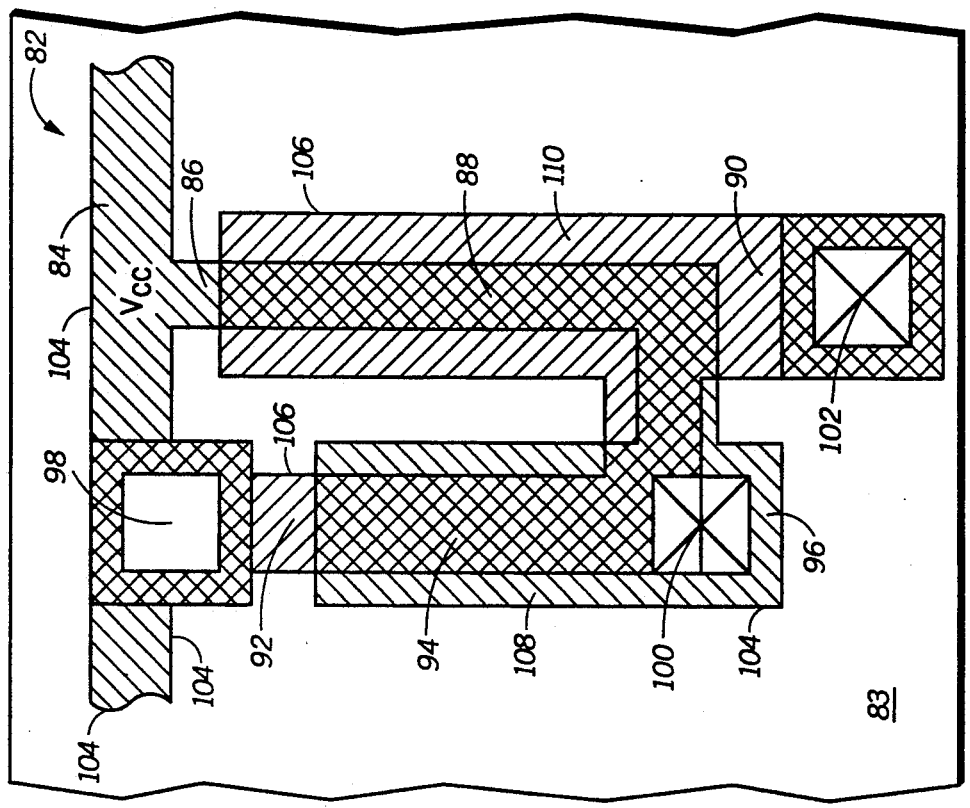
FIG. 4 illustrates, in top perspective view, yet another embodiment of a layout of a pair of load transistors in accordance with the present invention.
Figure 3:
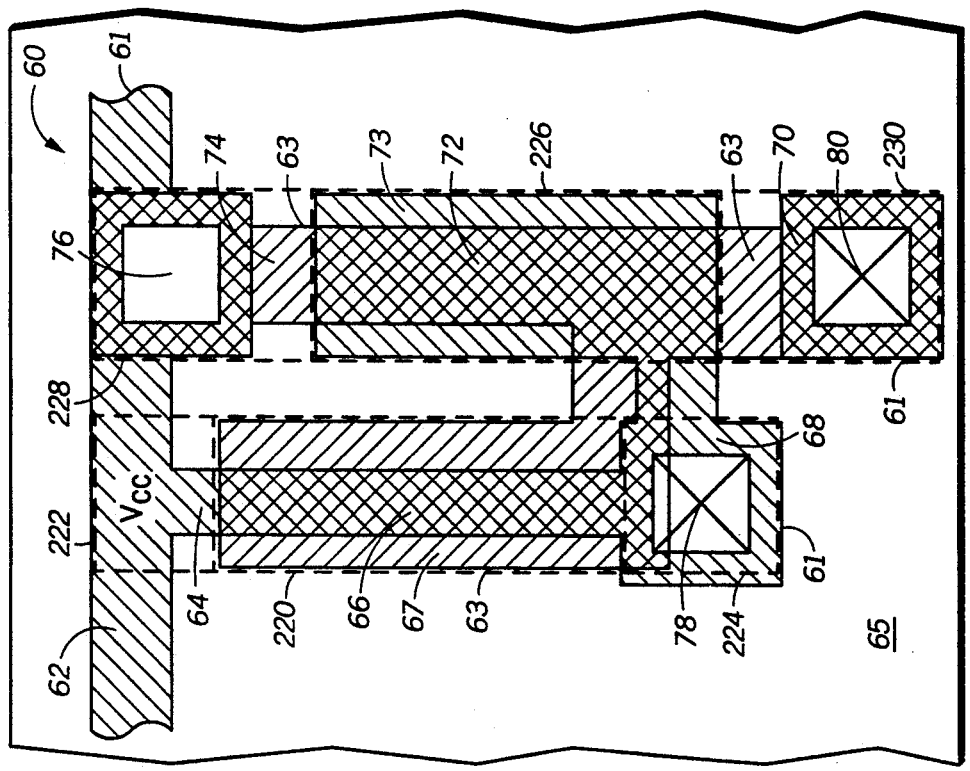
FIG. 3 illustrates, in top perspective view, another embodiment of a layout of a pair of load transistors in accordance with the present invention.

FIGS. 2-4 focus primarily on an implementation of transistors 12 and 14, which are usually TFTs, and their interconnections, although references may be made to other elements of FIG. 1 for purposes of understanding conductor connections. FIGS. 2-4 contains layouts that illustrate how transistors 12 and 14 can be reduced to a minimal geometry or designed with improved device performance. Minimal geometry is achieved through the use of combining over-gated and under-gated transistors, reducing process dependance on photolithographic limitations, and reducing the number of FSRAM cell inter-conductive-layer contacts. Improved device performance is achieved by selectively increasing various node capacitances of transistors 12 and 14 of FIG. 1. Improved storage node capacitance for conductors 24 and 26 is very desirable in almost every FSRAM cell and other memory applications.

FIG. 2 illustrates a pair of TFTs (thin film transistors) 37 that can be used as load transistors 12 and 14 of FIG. 1. The TFTs 37 can be formed partly within a substrate 41, but in almost all cases the TFTs 37 will be formed overlying the substrate 41. FIG. 2 has a first continuous, conductive layer of material, referred to as a conductive region 38. A second continuous, conductive layer of material, referred to as a conductive region 39, underlies the conductive region 38. The conductive regions 38 and 39 can be made of polysilicon, epitaxial silicon, gallium-arsenide, silicon-germanium, or a similar conductive or semiconductive material or made within a doped portion or altered portion of the substrate 41.

Conductive region 39 has a Vcc or power supply conductor 42 which is used to form a first portion of the conductor 30 illustrated in FIG. 1. A first current electrode for a first transistor, referred to as a source region 54, is formed within a first physically distinct region or portion of conductive region 39 via diffusion technology, ion implantation techniques, knock-in processing, or the like. A channel region 52 is created out of a second physically distinct region or portion of conductive region 39. The channel region 52 is formed adjacent to the source region 54. A second current electrode for the first transistor, referred to as a drain region 50 is created out of a third physically distinct region or portion of conductive region 39 in a manner similar to that for source region 54. The drain region 50 is formed adjacent to the channel region 52. Any inventive TFT described herein as having a source region and a drain region, regardless of whether the TFT is under-gated or over-gated, can have a source region and a drain region that are both self-aligned to a gate region. A control electrode for the first transistor, referred to as a gate region 53, is formed out of a fourth physically distinct region of conductive region 38 and overlies channel region 52. The gate region 53 is connected to the drain region 50 by a portion of conductive region 39. Because the gate region 53 overlies the channel region 52, the first transistor formed by the source region 54, the drain region 50, the gate region 53, and the channel region 52 is referred to as being "over-gated".

Sources or drains can be defined as regions of doped material that supply mobile, charged carriers for a transistor. The mobile carriers can move throughout portions of a substrate lattice and other conductive or semiconductive materials resulting in current flow to and from a transistor. The channel region is defined as a region that separates a source and a drain and has a control electrode or a gate region which can control electrical conductivity in the channel region. Because of these definitions, the channel region 52 of the first transistor is limited to a distinct rectangular region of conductive region 39 that underlies gate region 53 and is bounded approximately by the dashed-line rectangle 200. The source region 54 and drain region 50 are limited to the conductive region 39, adjacent to the channel region 52, and respectively bounded approximately by the dashed-line rectangles 202 and 204. The dashed-line rectangles 202 and 204 have boundaries theoretically and physically defined by current flow and current flow direction. The gate region 53 is located within a portion of the conductive layer 38 and bounded approximately by a dashed-line rectangle 200. If a region is not capable of directing current flow directly into or out from the conductive channel region 52, then that region does not function as a source or drain. In the same manner, if a portion of the conductive region 38 cannot substantially alter the conductivity of the channel region 52, then that region cannot be considered as a portion of the gate region 53.

In FIG. 2, conductive region 38 has a Vcc or power supply conductor 40 which is used to form a second portion of the conductor 30 illustrated in FIG. 1. The power supply conductors 40 and 42 are connected together by an overlying or underlying conductive layer (not illustrated) so that the power supply conductors 40 and 42 are more electrically symmetric. A first current electrode for a second transistor, referred to as a source region 44, is formed within a first physically distinct region or portion of conductive region 38 via diffusion technology, ion implantation techniques, knock-in processing, or the like. A channel region 46 is created out of a second physically distinct portion of conductor 38. The channel region 46 is formed adjacent to source region 44. A second current electrode for the second transistor, referred to as a drain region 48 is created out of a third physically distinct region of conductive region 38 in a manner similar to that for the source region 44. The drain region 48 is formed adjacent to the channel region 46. A control electrode for the second transistor, referred to as a gate region 47, is formed out of a fourth physically distinct region of conductive region 39 and underlies the channel region 46. The gate region 47 is connected to the drain region 48 by a portion of conductive region 39. Because the gate region 47 underlies the channel region 46, the second transistor formed by the source region 44, the drain region 48, the gate region 47, and the channel region 46 is called "under-gated". It is important to note that each of conductive regions 38 and 39 has four physically distinct regions that function separately as a source, a drain, a gate, and a channel region of a specific transistor.

In more detail, due to the previously described definitions of sources, drains, and channels, the channel region 46 of the second transistor is limited to a distinct region of conductive region 38 that underlies gate region 47 and is bounded by a dashed-line rectangle 206. The source region 44 and drain region 48 are defined as areas contained within conductive region 38 adjacent to the channel region 46 and respectively bounded by dashed-line rectangles 208 and 210. The rectangular 208 and 210 have boundaries defined by current flow and direction of current flow. The gate region 47 is located within a portion of the conductive layer 39 and bounded approximately by a rectangle 206. The arguments stated above for the first transistor also apply to the second transistor. Stating the arguments again for clarity, if a region is not capable of directing current flow directly into or out from the conductive channel region 46, then that region does not function as a source or drain. In the same manner, if a portion of the conductive region 39 cannot substantially alter the conductivity of the channel region 46 then that region cannot be considered as a portion of the gate region 47.

In a central area of FIG. 2 there are two dimensions labeled as "A" and "B". Due to the fact that the first and second transistors are formed by two layers of material at different vertical levels, specifically conductive regions 38 and 39, the lengths of "A" and "B" can be much smaller than an equipment dependent lithographically defined resolution which limits conventional FSRAM TFT technology. The dimensions "A" and "B" are, in fact, only limited by an equipment dependent photolithographic alignment tolerance used to make the TFTs 37. Due to the fact that alignment tolerances are almost always smaller than photolithographic resolution, a reduction in the surface area of TFTs 37 results. This two-dimensional reduction in surface area helps to reduce the overall size of the FSRAM cell 10 of FIG. 1.

A first contact 58 lies within the drain region 50 of the first transistor and lies adjacent the gate region 46 of the second transistor. The contact 58 connects the first transistor, which functionally could be transistor 12 of FIG. 1, to the conductor 24 of FIG. 1. A second contact 56 lies adjacent to the gate region 53 of the first transistor and within the drain region 48 of the second transistor. The contact 56 connects the second transistor, which functionally could be the transistor 14 of FIG. 1, to the conductor 26 of FIG. 1. It is important to note that the TFTs 37 of FIG. 2 are not limited to FSRAM load transistors or to other applications implied by FIG. 1. The TFTs 37 illustrated in FIG. 1 can be used for any applications which require a pair of transistors connected in a mutual drain-to-gate or source-to-gate connected configuration. For example, the TFTs 37 can be used for a counter, a register, a 'weak' inverter, a timer, a flip-flop, and other applications.

In the above description of the TFTs 37, conductive region 39 is described as underlying conductive region 38. The topography and layering of FIG. 2 reveals that the conductive regions 39 and 38 could be laid down in an opposite order without affecting the functionality of the circuit. More specifically, conductive region 39 could be formed so that it is overlying, not underlying, the conductive region 38. This would alter the TFTs 37 so that the TFT that was over-gated in the previous explanation of FIG. 2 now becomes under-gated, and the TFT that was under-gated becomes over-gated. The circuit will functionally remain the same although a few process steps may change and the order in which integrated circuit masks are used will change.

FIG. 2 illustrates the use of under-gated and over-gated transistors to reduce the size of a pair of transistors. Photolithographic limitations are avoided by carefully positioning under-gated and over-gated portions of the TFTs 37. Most FSRAM conventional load transistors and TFT pairs of transistors require at least three contacts to other conductive layers in order to be interconnected properly. The TFTs 37 of FIG. 2 require only two contacts for proper interconnection. In general, the TFTs 37 of FIG. 2 achieve a reduced two-dimensional layout surface area which is extremely useful in very large scale integration (VLSI) applications and especially memory applications.

A reduced surface area is not always the most sought after or desirable characteristic in memory applications. For most memory applications, capacitance means a more robust circuit, greater data storing potential, and more stable operation, but tends to be expensive in terms of surface area. FIG. 3 illustrates a manner in which a pair of TFTs 60 can be laid out to form a pair of transistors functionally similar to that of FIG. 2 with a larger amount of conductive layer overlap and therefore a larger capacitance. The TFTs 60 of FIG. 3 each have a first and a second conductive layer, respectively referred to as conductive regions 63 and 61. Conductive layer 63 overlies conductive layer 61. Due to the fact that conductive layer 61 substantially underlies the conductive region 63, larger capacitive coupling results. When the TFTs 60 are used in a FSRAM application, for example, used as the transistors 12 and 14 in FIG. 1, the node capacitance of conductors 24 and 26 of FIG. 1 will increase. This increase in capacitance is desirable, especially due to the fact that the under-gated/over-gated nature of the TFTs 60 will achieve an increase in capacitance while at the same time reducing or maintaining the area of the FSRAM cell 10 of FIG. 1 to a geometry smaller than or equal to conventional, capacitive-coupled designs.

Due to the fact that FIG. 2 and FIG. 3 are very similar in functional design and only vary largely in terms of layout, a detailed description of the functionality of the FIG. 3 TFTs 60 will not be necessary. It should be noted that all the functionality, definitions, and flexibility of the TFTs 37 of FIG. 2 will apply to the TFTs 60 of FIG. 3.

FIG. 3 illustrates a first transistor which has a Vcc power supply conductive region 62. A first transistor has a source region 64 and a drain region 68 which are each respectively formed from a distinct and separate first and third portion or region of conductive region 61. A channel region 66 is formed from a second distinct portion or region of conductive layer 61. A gate region 67 is formed from a fourth distinct portion or region of a conductive region 63. The gate region 67 overlies the channel region 66. Because the gate region 67 overlies the channel region 66, the first transistor, formed by the source region 64, the drain region 68, the channel region 66, and the gate region 67, is referred to as being "over-gated".

A second transistor is connected to the power supply conductive region 62 via an interconnect or a contact 76. A first current region of the second transistor, referred to as a source region 74, is formed from a first distinct portion or region of the conductive region 63. A channel region 72 of the second transistor is formed from a second distinct region of conductive region 63. A drain region 70 is formed from a third distinct region of conductive region 63. A gate region 73 for the second transistor is formed from a fourth distinct region of the conductive region 61. Due to the fact that the gate region 73 underlies the channel region 72, the second transistor, formed by the source region 74, the drain region 70, the channel region 72, and the gate region 73, is referred to as being "under-gated".

In most cases the conductive regions 63 and 61 are formed overlying the substrate 65. There may be a few applications wherein one of the conductive layers 63 or 61 may lie within the substrate 65 or be technically defined as the entire substrate 65. In this case, diffused, implanted, and/or doped regions will form portions of the TFTs 60.

In a manner similar to FIG. 2, the gate regions 67 and 73 and channel regions 66 and 72 are bounded within portions of their respective conductive layers 61 and 63 which are surrounded by a dashed-line rectangle 220 for the first transistor and dashed-line rectangle 226 for the second transistor. In addition, the source regions 64 and 74 are bounded respectively within portions of conductive layers 61 and 63 which are surrounded by a dashed-line rectangle 222 for the first transistor and dashed-line rectangle 228 for the second transistor. The drain regions 68 and 70 are bounded respectively within portions of conductive layers 61 and 63 which are surrounded by a dashed-line rectangle 224 for the first transistor and dashed-line rectangle 230 for the second transistor.

A contact 78 connects the drain region 68 of the first transistor to another conductive layer (not illustrated). In the case of the FSRAM cell 10 the first transistor of FIG. 3 is equivalent to the transistor 12 of FIG. 1. In this case, the contact 78 of FIG. 3 connects the drain region 68 of the first transistor or transistor 12 to the conductor 24 of FIG. 1. In a similar manner, the contact 80 connects the drain region 70 of the second transistor in FIG. 3 to another conductive layer (not illustrated). If applied to the FSRAM cell 10, contact 80 connects the second transistor of FIG. 3, or equivalently the transistor 14 of FIG. 1, to the conductor 26 of FIG. 1.

Although the TFTs 60 of FIG. 3 offer a larger capacitance when compared to the TFTs 37 of FIG. 2, the TFTs 60 are not as compact as the TFTs 37 of FIG. 2. The TFTs 60 also require four contacts 76, 78, and 80 (two of the four contacts are stacked on top of each other between multiple conductive layers and referred to as one contact 80) instead of the two contacts 56 and 58 for the TFTs 37. These extra contacts are not a disadvantage when compared to most conventional TFT pair technology due to the fact that a substantial amount of FSRAM load transistor conventional designs have three or more contacts or a large surface area due to layout limitations. The capacitance gain for the TFTs 60 is useful for memory applications and other applications requiring capacitance for more reliable performance. In addition, the layouts illustrated in FIGS. 3 and 4 allow the channel regions 220 and 226 to be longer than conventional TFTs while maintaining the same surface area. The added length of the channel regions 220 and 226 allows a TFT to provide lower off-current, which is very benificial for low power static RAMs.

FIG. 4 illustrates how the over-gated first and under-gated second transistors of FIG. 3 can be switched in layout to produce an under-gated first transistor and an over-gated second transistor. Because the functionality, the usefulness, and the regions have not changed significantly from the TFTs 60 in FIG. 3, the description for FIG. 4 will be brief. FIG. 4 structures should be allowed all of the flexibility of the TFTs 60 of FIG. 3 and the TFTs 37 of FIG. 2.

A pair of TFTs 82 is illustrated in FIG. 4. The first transistor has a source region 92, a drain region 96 and a channel region 94, each formed from three respective distinct regions of a conductive region 106. A gate region 108 underlies the channel region 94, making the first transistor an under-gated transistor. The second transistor has a source region 86, a channel region 88, and a drain region 90, each formed from three respective distinct regions of a conductive region 104. A gate region 110 is formed from a distinct portion of the conductive region 106 and overlies the channel region 88. An under-gated first transistor and an over-gated second transistor have been created which can be applied to the FSRAM cell 10 of FIG. 1 or to other applications which could benefit from two TFTs connected in a similar manner.

It should be apparent that the combination of over-gated and under-gated transistors can result in the following: (1) reduced TFT layout surface area due to reduced dependence on lithographic limitations; (2) reduced TFT layout surface area due to a reduced number of contacts; (3) simple, reproducible etch processing steps for contacts; and (4) the possibility for greater capacitance when used for memory applications wherein the surface area of the memory cell does not increase when compared to conventional technology.

While the present invention has been illustrated and described with reference to specific embodiments, further modifications and improvements will occur to those skilled in the art. For example, the TFTs are not limited to a specific geometry or conductivity type. The TFTs can both be N-type, both be P-type, or be made of opposite conductivity types. Other technologies can be used with the inventive devices described herein, such as, epitaxial source and drain extensions, threshold voltage adjustment implants, various etch processes, and not depart from the claimed invention. Many different materials can be used for isolation, conductive layers, contact definition, masking sequences, and other processing steps and not change the functionality of the TFTs presented herein. The TFTs presented herein can also be used in many applications other than FSRAM load transistors. It is to be understood, therefore, that this invention is not limited to the particular forms illustrated and that it is intended in the appended claims to cover all modifications that do not depart from the spirit and scope of this invention.

We claim:

1. A layout of a pair of first and second transistors, comprising:
    a first continuous, conductive layer of material, the first layer of material having first, second, third, and fourth physically distinct regions which respectively function as a first current electrode of the first transistor, a channel region of the first transistor, a second current electrode of the first transistor, and a control electrode of the second transistor; and
    a second continuous, conductive layer of material partially overlying the first continuous, conductive layer of material, the second layer of material having first, second, third, and fourth physically distinct regions which respectively function as a first current electrode of the second transistor, a channel region of the second transistor, a second current electrode of the second transistor, and a control electrode of the first transistor.

2. The layout of claim 1 wherein the second continuous layer of material is positioned relative to the first continuous layer of material by a dimension which is not limited by lithographic resolution capabilities.

3. The layout of claim 1 wherein the second continuous layer of material is positioned relative to the first continuous layer of material by a dimension which is determined by a predetermined equipment alignment tolerance.

4. A layout of a pair of first and second transistors, comprising:
    a first continuous, conductive layer of material, the first layer of material having first, second, third, and fourth physically distinct regions which respectively function as a first current electrode of the first transistor, a channel region of the first transistor, a second current electrode of the first transistor, and a control electrode of the second transistor; and
    a second continuous, conductive layer of material partially overlying the first continuous, conductive layer of material, the second layer of material having first, second, third, and fourth physically distinct regions which respectively function as a first current electrode of the second transistor, a channel region of the second transistor, a second current electrode of the second transistor, and a control electrode of the first transistor, the second conductive, continuous layer of material substantially overlying the first conductive, continuous layer of material to increase capacitance between the first and second continuous layers of material.

5. The layout of claim 1 wherein the first and second current electrodes of the first transistor are self-aligned to the control electrode of the first transistor.

6. The layout of claim 1 wherein the first and second continuous layers of material are each made of polysilicon.

7. The layout of claim 1 wherein the first, second, third, and fourth physically distinct regions of the first conductive layer of material are a same first material, and the first, second, third, and fourth physically distinct regions of the second conductive layer of material are a same second material.

8. The layout of claim 1 wherein the first and second transistors are a pair of load transistors for a RAM memory cell.

9. A layout of a pair of first and second transistors in a RAM memory cell, comprising:
    a first load transistor formed by the first transistor;
    a second load transistor formed by the second transistor;
    a substrate layer of material;
    a first continuous, conductive layer of material overlying the substrate layer of material, the first layer of material having first, second, third, and fourth physically distinct regions which respectively function as a first current electrode of the first load transistor, a channel region of the first load transistor, a second current electrode of the first load transistor, and a control electrode of the second load transistor;
    a second continuous, conductive layer of material partially overlying the first continuous, conductive layer of material, the second layer of material having first, second, third, and fourth physically distinct regions which respectively function as a first current electrode of the second load transistor, a channel region of the second load transistor, a second current electrode of the second load transistor, and a control electrode of the first load transistor;
    a power supply conductor connected to the first current electrode of the first load transistor and connected to the first current electrode of the second load transistor;
    a first storage node conductor connected to the second current electrode of the first load transistor and connected to the control electrode of the second load transistor; and
    a second storage node conductor connected to the second current electrode of the second load transistor and connected to the control electrode of the first load transistor.

10. The layout of claim 9 wherein the first and second continuous layers of material are each made of polysilicon.

11. The layout of claim 9 wherein the first conductive layer of material is a first same material in each of the first, second, third, and fourth regions, and the second conductive layer of material is a second same material in each of the first, second, third, and fourth regions.

12. The layout of claim 1 wherein the second conductive, continuous layer of material substantially overlies the first conductive, continuous layer of material to increase capacitance between the first and second continuous layers of material.

13. The layout of claim 4 wherein the second continuous layer of material is positioned relative to the first continuous layer of material by a dimension which is not limited by lithographic resolution capabilities.

14. The layout of claim 4 wherein the second continuous layer of material is positioned relative to the first continuous layer of material by a dimension which is determined by a predetermined equipment alignment tolerance.

15. The layout of claim 4 wherein the first and second current electrodes of the first transistor are self-aligned to the control electrode of the first transistor.

16. The layout of claim 4 wherein the first and second continuous layers of material are each made of polysilicon.

17. The layout of claim 4 wherein the first, second, third, and fourth physically distinct regions of the first conductive layer of material are a same first material, and the first, second, third, and fourth physically distinct regions of the second conductive layer of material are a same second material.

18. The layout of claim 4 wherein the first and second transistors are a pair of load transistors for a random access memory cell.

* * * * *